(12) United States Patent
Ozaki et al.

(10) Patent No.: US 9,608,083 B2
(45) Date of Patent: Mar. 28, 2017

(54) SEMICONDUCTOR DEVICE

(71) Applicant: FUJITSU LIMITED, Kawasaki-shi, Kanagawa (JP)

(72) Inventors: Shirou Ozaki, Kawasaki (JP);
Masahito Kanamura, Kawasaki (JP);
Norikazu Nakamura, Kawasaki (JP);
Toyoo Miyajima, Kawasaki (JP);
Masayuki Takeda, Kawasaki (JP);
Keiji Watanabe, Kawasaki (JP);
Toshihide Kikkawa, Kawasaki (JP);
Kenji Imanishi, Kawasaki (JP);
Toshihiro Ohki, Kawasaki (JP);
Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/735,050

(22) Filed: Jun. 9, 2015

(65) Prior Publication Data

US 2015/0279956 A1    Oct. 1, 2015

Related U.S. Application Data

(62) Division of application No. 13/276,521, filed on Oct. 19, 2011, now abandoned.

(30) Foreign Application Priority Data

Oct. 19, 2010  (JP) ................ 2010-234961

(51) Int. Cl.
H01L 29/51     (2006.01)
H01L 23/29     (2006.01)
(Continued)

(52) U.S. Cl.
CPC ........ H01L 29/517 (2013.01); H01L 21/0228 (2013.01); H01L 23/291 (2013.01);
(Continued)

(58) Field of Classification Search
CPC ....... H01L 29/78; H01L 29/772; H01L 29/51; H01L 29/417; H01L 29/423; H01L 29/20;
(Continued)

(56) References Cited

U.S. PATENT DOCUMENTS 7,335,609 B2    2/2008  Ingle et al.
7,419,862 B2 *  9/2008  Lim et al. .............. 438/197
(Continued)

FOREIGN PATENT DOCUMENTS

CN      1989601 A      6/2007
CN      101335296 A    12/2008
(Continued)

OTHER PUBLICATIONS

Chinese Office Action, for the Corresponding CN Application No. 201110326799.X, mailed on Apr. 27, 2015, with full translation.
(Continued)

*Primary Examiner* — Chuong A Luu
(74) *Attorney, Agent, or Firm* — Kratz, Quintos & Hanson, LLP

(57) ABSTRACT

A semiconductor device includes a first semiconductor layer formed over a substrate, a second semiconductor layer formed over the first semiconductor layer, a source electrode and a drain electrode formed over the second semiconductor layer, an insulating film formed over the second semiconductor layer, a gate electrode formed over the insulating film, and a protection film covering the insulating film, the protection film being formed by thermal CVD, thermal ALD, or vacuum vapor deposition.

10 Claims, 18 Drawing Sheets

(51) Int. Cl.
  *H01L 29/20* (2006.01)
  *H01L 29/417* (2006.01)
  *H01L 29/423* (2006.01)
  *H01L 29/66* (2006.01)
  *H01L 29/778* (2006.01)
  *H01L 21/02* (2006.01)

(52) U.S. Cl.
  CPC .... *H01L 29/2003* (2013.01); *H01L 29/41766* (2013.01); *H01L 29/4236* (2013.01); *H01L 29/518* (2013.01); *H01L 29/66462* (2013.01); *H01L 29/7786* (2013.01); *H01L 29/7787* (2013.01); *H01L 29/42376* (2013.01); *H01L 2924/0002* (2013.01)

(58) Field of Classification Search
  CPC . H01L 29/778; H01L 29/517; H01L 29/7787; H01L 29/2003; H01L 29/4236; H01L 29/518; H01L 29/41766; H01L 29/7786
  USPC .................................. 257/330, 288, 43, 401
  See application file for complete search history.

(56) References Cited

U.S. PATENT DOCUMENTS

| | | | |
|---|---|---|---|
| 7,859,014 | B2 | 12/2010 | Nakayama et al. |
| 7,955,984 | B2* | 6/2011 | Ohki ............... H01L 29/7787 257/194 |
| 2001/0013607 | A1* | 8/2001 | Miyasaka ............ F16C 29/00 257/66 |
| 2004/0137761 | A1* | 7/2004 | Inoue et al. ................. 438/796 |
| 2005/0248270 | A1* | 11/2005 | Ghosh et al. ................. 313/512 |
| 2006/0019435 | A1 | 1/2006 | Sheppard et al. |
| 2006/0054925 | A1 | 3/2006 | Kikkawa |
| 2007/0254418 | A1 | 11/2007 | Sheppard et al. |
| 2008/0119098 | A1* | 5/2008 | Palley ................ C23C 16/305 442/64 |
| 2008/0157121 | A1 | 7/2008 | Ohki |
| 2008/0157363 | A1* | 7/2008 | Mayya Kolake et al. .... 257/741 |
| 2008/0284022 | A1 | 11/2008 | Ehara |
| 2009/0001381 | A1 | 1/2009 | Marui et al. |
| 2009/0039351 | A1 | 2/2009 | Kobayashi et al. |
| 2009/0045439 | A1 | 2/2009 | Hoshi et al. |
| 2009/0140262 | A1 | 6/2009 | Ohki et al. |
| 2009/0280600 | A1* | 11/2009 | Hosono ............... C23C 14/0021 438/104 |
| 2010/0091428 | A1 | 4/2010 | Kim et al. |
| 2010/0140664 | A1 | 6/2010 | Sheppard et al. |
| 2010/0171150 | A1 | 7/2010 | Smith et al. |
| 2010/0187570 | A1 | 7/2010 | Saxler et al. |
| 2010/0210080 | A1* | 8/2010 | Nomura et al. .............. 438/197 |
| 2011/0084272 | A1 | 4/2011 | Miyanaga et al. |
| 2011/0092017 | A1 | 4/2011 | Akimoto et al. |
| 2011/0180802 | A1* | 7/2011 | Morosawa .......... H01L 29/7869 257/59 |
| 2011/0269266 | A1* | 11/2011 | Yamazaki ......... H01L 21/02554 438/104 |
| 2012/0074426 | A1 | 3/2012 | Ohki et al. |
| 2012/0223319 | A1* | 9/2012 | Dora ................... H01L 29/2003 257/76 |
| 2014/0235054 | A1 | 8/2014 | Lansalot-Matras et al. |

FOREIGN PATENT DOCUMENTS

| | | |
|---|---|---|
| CN | 101506958 A | 8/2009 |
| JP | 2008103408 A1 | 5/2008 |
| JP | 20090045439 | 2/2009 |
| JP | 200949121 | 3/2009 |
| JP | 2010080633 | 4/2010 |
| WO | 2006001369 | 1/2006 |

OTHER PUBLICATIONS

Chinese Office Action, for the Corresponding CN Application No. 201110326799.X, mailed on Aug. 22, 2014, with English translation.

Japanese Office Action, for the Corresponding JP Application No. 2010-234961, mailed on Jul. 1, 2014, with English translation.

* cited by examiner

SEMICONDUCTOR DEVICE

CROSS REFERENCE TO RELATED APPLICATIONS

This application is a Divisional Application of Ser. No. 13/276,521 filed on Oct. 19, 2011 now ABN, which is based upon and claims the benefit of priority of the prior Japanese Patent Application No. 2010-234961 filed on Oct. 19, 2010, the entire contents of both of which are incorporated herein by reference.

FIELD

The embodiments discussed herein relate to a semiconductor device and a manufacturing method thereof.

BACKGROUND

A AlGaN/GaN heterojunction field-effect transistor using a GaN layer as an electron transit layer is known. GaN is a wide bandgap material with high breakdown voltage and high saturation electron velocity. GaN is a promising material that may realize a high-current, high-voltage and low ON-resistance semiconductor device. Accordingly, many studies and much research have been conducted on a GaN-based semiconductor device as the next-generation high-performance switching device.

In general, in a semiconductor device such as a field-effect transistor, an insulating film is formed over the entire surface of the devices (such as the field-effect transistors) for the purpose of passivation after the gate electrodes or the drain electrodes are fabricated.

To realize a high-performance switching device using a power transistor, it is desired to reduce the ON-resistance, while realizing normally-off behavior and high breakdown voltage of the switching device. Low ON-resistance and Normally-off behavior can be realized by improving the GaN crystal quality and/or improving the crystal qualities of the materials used in the transistors. On the other hand, it is in general difficult for a switching device using a Schottky gate structure to realize a high breakdown voltage because dielectric strength of several hundreds volts to several kilovolts is required depending on applications. To overcome this issue, it is proposed to insert an insulating film between a gate electrode and a semiconductor layer to reduce gate leakage current and enhance the dielectric strength.

A protection film or a passivation film of an insulation material is also provided to a transistor with an insulating film inserted between the gate electrode and the semiconductor layer. However, the protection film may lower the dielectric strength of the transistor, and as a result, a sufficient level of dielectric strength may not be achieved.

Accordingly, it is desired to achieve sufficient dielectric strength in a semiconductor device, such as a transistor, with an insulating film provided between a gate electrode and a semiconductor layer.

PRIOR ART DOCUMENT

Patent Document 1: Japanese Laid-Open Patent Publication No. 2008-103408
Patent Document 2: U.S. Publication No. 2006/0019435 A1

SUMMARY

According to one aspect of the present disclosure, a semiconductor device includes a first semiconductor layer formed over a substrate; a second semiconductor layer formed over the first semiconductor layer; a source electrode and a drain electrode formed over the second semiconductor layer; an insulating film formed over the second semiconductor layer; a gate electrode formed over the insulating film; and a protection film covering the insulating film, the protection film being formed by thermal CVD, thermal ALD, or vacuum vapor deposition.

According to another aspect of the present disclosure, a semiconductor device includes a first semiconductor layer formed over a substrate; a second semiconductor layer formed over the first semiconductor layer; a source electrode and a drain electrode formed over the second semiconductor layer; a recess formed in the second semiconductor layer, or in the second semiconductor layer and a portion of the first semiconductor layer; an insulating film formed over the second semiconductor layer and in the recess; a gate electrode formed on the insulating film inside the recess; and a protection film covering the insulating film, the protection film being formed by thermal CVD, thermal ALD, or vacuum vapor deposition.

According to still another aspect of the present disclosure, a semiconductor device manufacturing method is provided. The method includes:

forming a first semiconductor layer and a second semiconductor layer in this order over a substrate;

forming a source electrode and a drain electrode over the second semiconductor layer;

forming an insulating film over the second semiconductor layer;

forming a gate electrode over the insulating film, and forming a protection film by thermal CVD, thermal ALD, or vacuum vapor deposition so as to cover the insulating film.

According to yet another aspect of the present disclosure, a semiconductor device manufacturing method includes:

forming a first semiconductor layer and a second semiconductor layer in this order over a substrate;

forming a source electrode and a drain electrode over the second semiconductor layer;

forming a recess in the second semiconductor layer;

forming an insulating film over the second semiconductor layer and in the recess;

forming a gate electrode on the insulating film inside the recess; and forming a protection film by thermal CVD, thermal ALD, or vacuum vapor deposition so as to cover the insulating film.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

DESCRIPTION OF EMBODIMENTS

The embodiments are now described with reference to accompanying drawings. The same elements or components are denoted by the same symbols and redundant explanation for them is omitted.

First Embodiment

Figure 1:
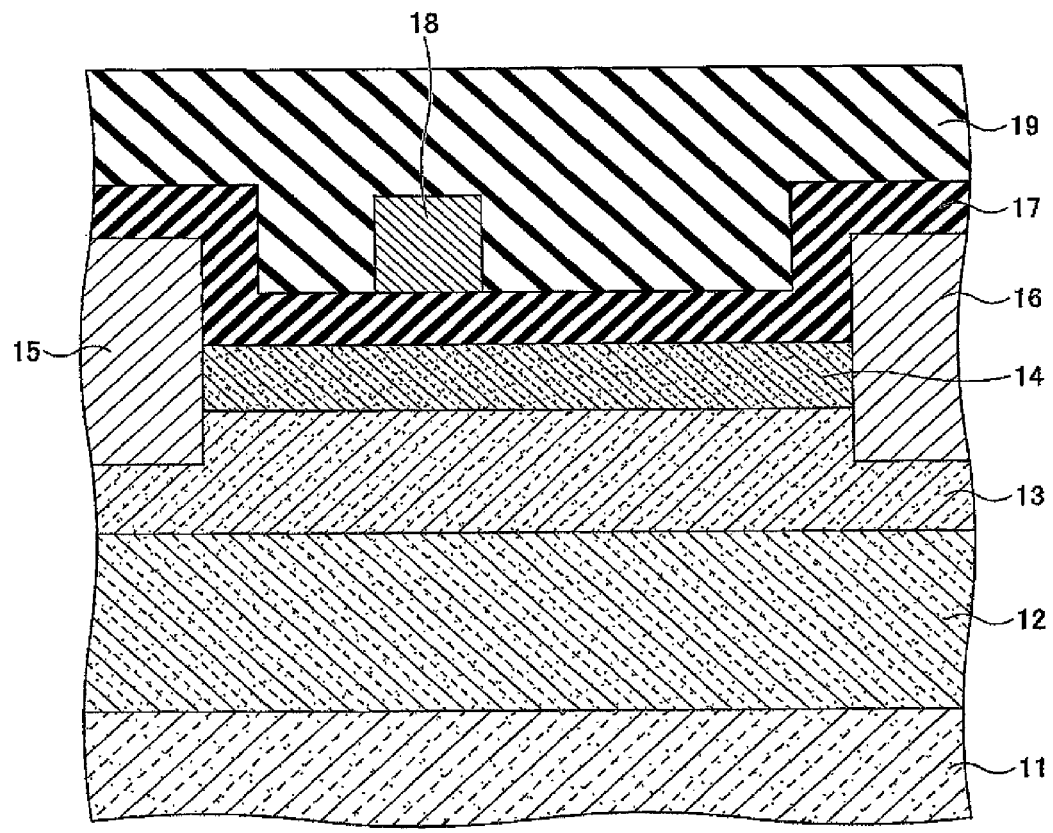
FIG. 1 is a schematic diagram illustrating a cross-sectional structure of a high electron mobility transistor (HEMT) covered with a protection film.

First, explanation is made of a structure of a transistor in which an insulating film is provided between a gate electrode and a semiconductor layer, the transistor being covered with a protection film made of an insulating material, with reference to FIG. 1. This type of transistor is called a high electron mobility transistor (HEMT) in which an electron transit layer 12, a barrier layer 13, and a cap layer 14 are epitaxially grown in this order on a substrate 11. A source electrode 15 and a drain electrode 16 are connected to the barrier layer 13. An insulating film 17 is formed over the cap layer 14, and a gate electrode 18 is formed over the insulating film 17. A protection film 19 is provided so as to cover the entire surface including the insulating film 17.

The substrate 11 is, for example, a SiC substrate, a sapphire ($Al_2O_3$) substrate, or any other suitable substrate. The electron transit layer 12 is an intrinsic GaN (i-GaN) layer. The barrier layer 13 is formed of n-type AlGaN (n-AlGaN). The cap layer 14 is formed of n-type GaN (n-GaN). The insulating film 17 is an aluminum oxide ($Al_2O_3$) layer formed by plasma ALD (atomic layer deposition). The protection film 19 is formed of, for example, silicon nitride (SiN), silicon oxide ($SiO_2$), or aluminum oxide ($Al_2O_3$). To form the protection film 19, plasma CVD (chemical vapor deposition) is typically employed from the viewpoint of improving the throughput because of the satisfactory film formation rate.

Figure 2:
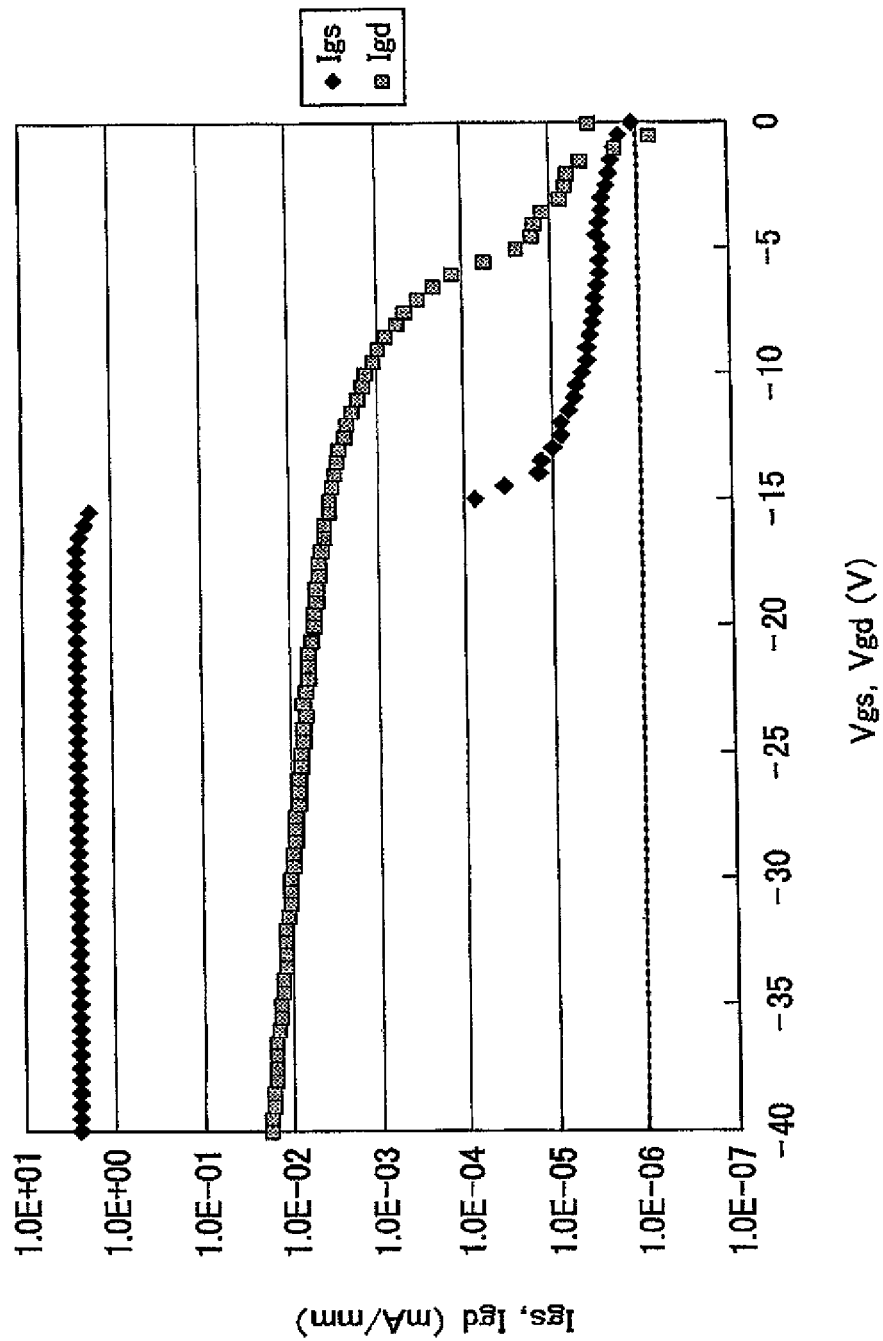
FIG. 2 is a graph illustrating gate current characteristics of an HEMT with a protection film formed by a plasma CVD method.
Figure 3:
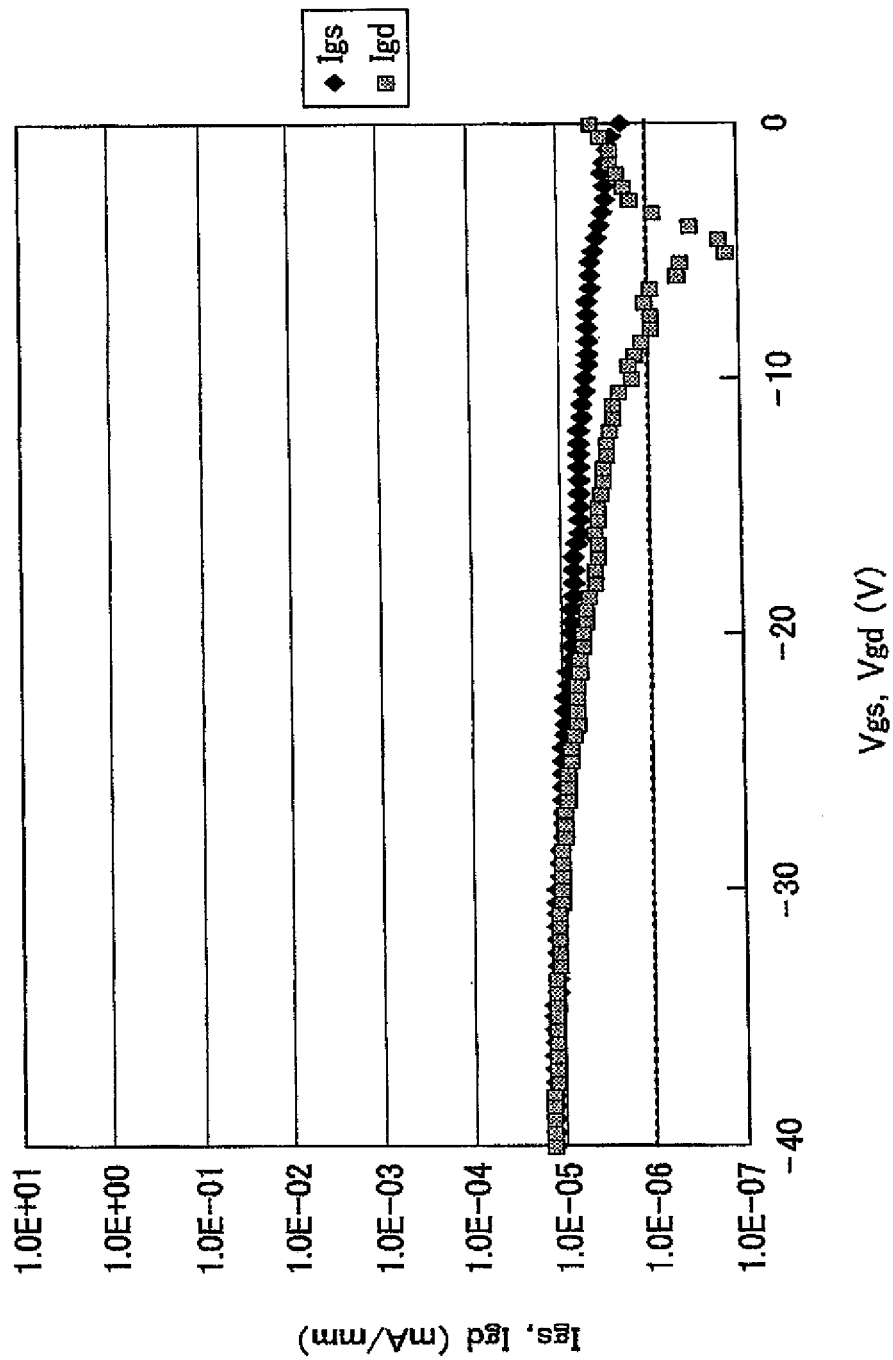
FIG. 3 is a graph illustrating gate current characteristics of an HEMT without a protection film.

FIG. 2 illustrates the relationship between gate-source voltage (Vgs) and gate-source current (Igs) together with the relationship between gate-drain voltage (Vgd) and gate-drain current (Igd) of a transistor after the above-described protection film 19 is formed. FIG. 3 illustrates the relationship between gate-source voltage (Vgs) and gate-source current (Igs) together with the relationship between gate-drain voltage (Vgd) and gate-drain current (Igd) of the transistor before the protection film 19 is provided.

As is clear from FIG. 2 and FIG. 3, without the protection film 19, the gate-source current (Igs) and the gate-drain current (Igd) are sufficiently low, which are suppressed to less than 10 nA/mm. Gate leakage currents increase significantly in a transistor with the protection film 19 formed therein, as compared with a transistor without the protection film 19. In other words, formation of the protection film 19 causes gate leakage current to increase and degrades the characteristics of the transistor. The same phenomenon is observed even if the insulating film 17 is formed of $HfO_2$.

The inventors made an intensive study on why gate leakage current increases significantly when the protection film 19 is provided, and found that the increase of gate leakage current is attributed to the film formation method of the protection film 19.

Table 1 illustrates source-drain dielectric strengths of aluminum oxide protection films 19 formed by several techniques.

TABLE 1

| DEPOSITION METHOD | DIELECTRIC STRENGTH (Before Formation of Protection Film) | DIELECTRIC STRENGTH (After Formation of Protection Film) |
|---|---|---|
| Plasma CVD | 390 V | 150 V |
| Plasma ALD | 400 V | 200 V |
| Sputtering | 380 V | 140 V |
| Thermal ALD | 400 V | 400 V |

As illustrated in Table 1, when an aluminum oxide protection film 19 is provided by means of plasma CVD to the transistor with a dielectric strength of 390 V, the dielectric strength significantly falls to 150 V after the formation of the protection film 19. When forming an aluminum oxide protection film 19 by plasma ALD in the transistor having a dielectric strength of 400 V, the dielectric strength decreases to 200 V after the formation of the protection film 19. If an aluminum oxide protection film 19 is formed by sputtering in the transistor with a dielectric strength of 380 V, the dielectric strength lowers to 140 V after the formation of the protection film 19. In contrast, when thermal ALD is employed to form an aluminum oxide protection film 19 in a transistor with a dielectric strength of 400 V, the dielectric strength is maintained at 400 V even after the formation of the protection film 19. Thermal ALD is a film deposition technique to form a film by alternately supplying source gases onto a heated substrate without producing plasma.

From the above experimental results, it is speculated that the increase of gate leakage current in a transistor with a protection film 19 is attributed to a plasma CVD process employed to form the aluminum oxide film.

Plasma CVD, plasma ALD, and sputtering are film deposition techniques using a plasma process, while thermal ALD is a non-plasma process.

It may be concluded from the above-described assumptions that the dielectric strength is degraded and causes the gate leakage current to increase due to the plasma process for forming the aluminum oxide protection film 19. When thermal ALD is used to form the aluminum oxide protection film 19, the dielectric strength is maintained. Accordingly, gate leakage current can be prevented from increasing by employing a non-plasma process, such as a thermal ALD process, to form an aluminum oxide protection film 19. Examples of non-plasma process include thermal ALD, thermal CVD, vacuum vapor deposition (including resistive heating and electron beam evaporation).

Figure 4:
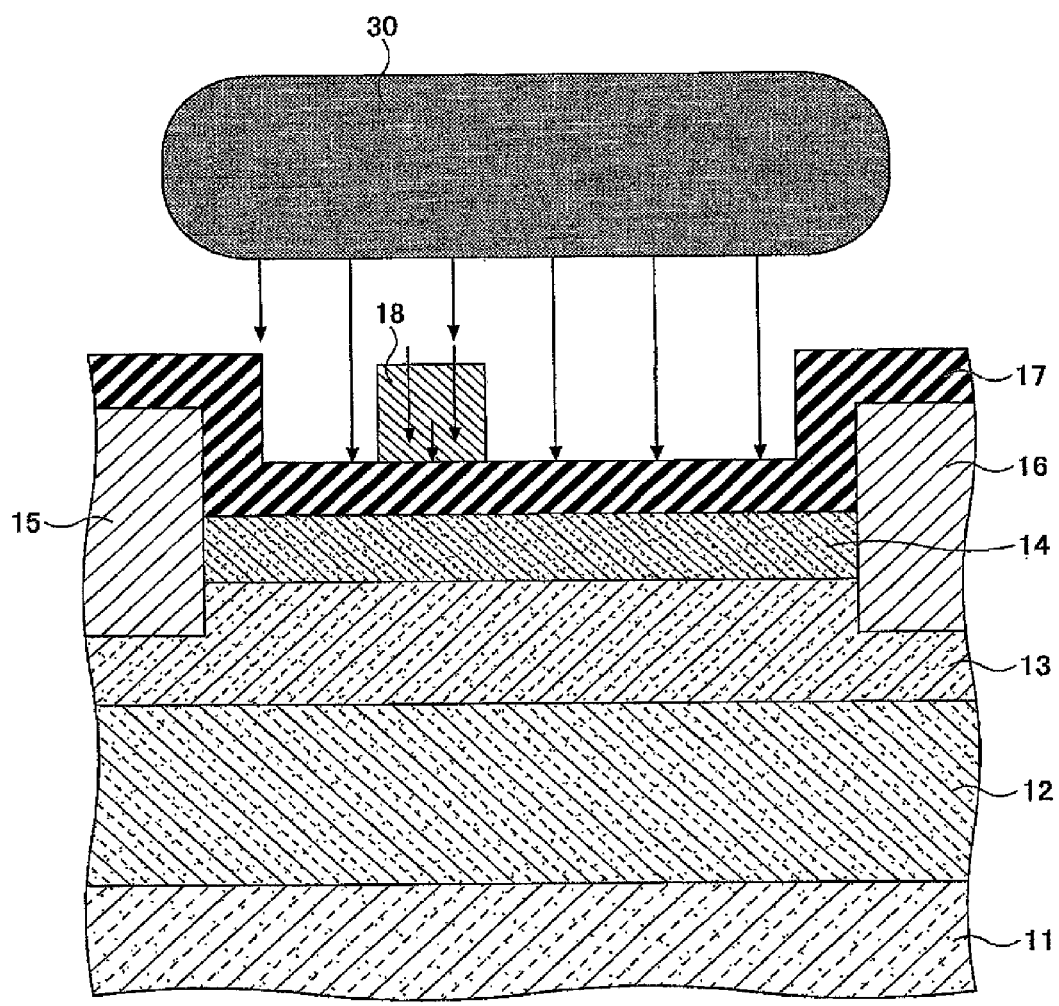
FIG. 4 is a schematic diagram illustrating formation of a protection film by means of plasma CVD.

Next, explanation is made of a mechanism of increasing gate leakage current when an aluminum oxide protection film 19 is formed by a plasma process such as plasma CVD. FIG. 4 illustrates formation of a protection film 19 over a structure in which the insulating film 17 and the gate electrode 18 are arranged, by a film deposition method using a plasma process. In a plasma process, electrically charged particles produced by plasma 30 get into the insulating film 17 through the gate electrode 18. It is presumed that the electrically charged particles cause defects in the insulating film 17 and cause gate leakage current to increase. Because the surface of the insulating film 17 is exposed to plasma, it is also presumed that defects are produced due to plasma damage in the surface region of the insulating film 17. Under these presumptions, dielectric strength of the insulating film 17 is supposed to be degraded as long as the protection film 19 is formed by a plasma process such as plasma CVD, even if a metallic oxide, an oxynitride, or a nitride is used to form the insulating film 17.

Degradation of dielectric strength of a transistor has not been perceived with suspicion although the same phenomenon may have occurred conventionally when a protection film 19 is formed by a plasma process such as plasma CVD. The reason why this phenomenon has not been perceived is that a conventional semiconductor material such as Silicon or GaAs has a narrower bandgap compared with GaN. For narrow-bandgap materials, the actually used voltage range is lower than a voltage range in which degradation of dielectric strength becomes a problem, and accordingly, degradation of dielectric strength due to a protection film 19 formed by a plasma process such as plasma CVD has not come to be a practical issue so far. In other words, the issue of degradation of dielectric strength due to formation of the protection film 19 using a plasma process has come to the surface when a wide-bandgap semiconductor material such as GaN is used.

When forming an aluminum oxide film by plasma ALD, trimethylaluminum (TMA: $(CH_3)_3Al$) and oxygen are supplied as source materials to produce plasma. Alternatively, TMA and oxygen plasma may be alternately supplied in plasma ALD. When forming an aluminum oxide film by a sputtering process, aluminum oxide is used as a target, and argon (Ar) and oxygen are supplied as sputtering gases. Alternatively, aluminum (Al) may be used as a target, and argon (Ar) and oxygen are used as sputtering gases to perform sputtering. When forming an aluminum oxide film by thermal ALD, a substrate is heated, and TMA and water are alternately supplied as source materials. During the thermal ALD process, no plasma is generated in a deposition chamber.

In an insulating film formed by plasma CVD, $5*10^{20}$/cm3 or more of hydrogen molecules are contained. In an insulating film formed by plasma ALD, the amount of hydrogen molecules contained therein is equal to or less than $1*10^{20}$/cm3, and the amount of water molecules contained therein is equal to or less than $1*10^{20}$/cm3. In an insulating film formed by thermal ALD, the amount of hydrogen molecules contained therein is equal to or less than $1*10^{20}$/cm3, while the amount of water molecules contained therein is at or above $1*10^{20}$/cm3. Thus, the film deposition method can be identified by measuring the amounts of hydrogen molecules and water molecules in the insulating film.

Semiconductor Device Manufacturing Method

Next, explanation is made of a semiconductor device manufacturing method according to the embodiment, in conjunction with FIG. 5A through FIG. 5F.

Figure 5A:
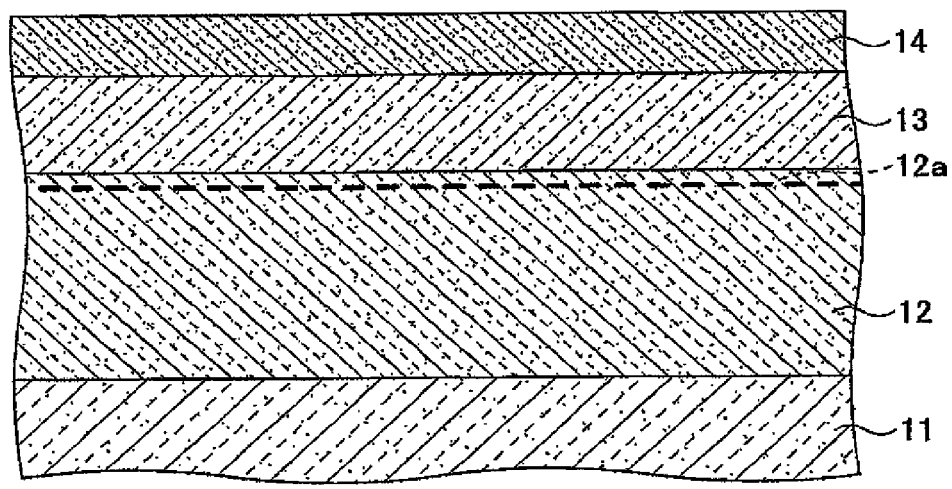
FIG. 5A illustrates in a cross-sectional view a semiconductor device manufacturing method according to the first embodiment.

As illustrated in FIG. 5A, a nucleation layer (not shown) is formed over a substrate 11. Semiconductor layers, including an electron transit layer 12, a barrier layer 13, and a cap layer 14, are epitaxially grown in this order by metal-organic vapor phase epitaxy (MOVPE).

The substrate 11 is, for example, a SiC substrate or a sapphire ($Al_2O_3$) substrate. The nucleation layer (not shown) formed over the substrate 11 is, for example, a non-doped intrinsic AlN (i-AlN) layer with a thickness of 0.1 μm. The electron transit layer 12, which is the first semiconductor layer, is a non-doped intrinsic GaN (i-GaN) layer with a thickness of 3.0 μm. The barrier layer 13, which is the second semiconductor layer, is a non-doped intrinsic $Al_{0.25}Ga_{0.75}N$ layer with a thickness of 20 nm. The cap layer 14, which is the third semiconductor layer, is a n-GaN layer with a thickness of 5 nm. With this layered structure, a two-dimensional electron gas (2DEG) channel 12a is produced in the electron transit layer 12 near the barrier layer 13.

To form the semiconductor layers 12-14, a source gas such as trimethylaluminum (TMA), trimethylgallium (TMG), or ammonia ($NH_3$) is used. The supply quantity of the source gas is adjusted according to the composition of the semiconductor layer to be formed. The flow rate of ammonia gas used to form the semiconductor layers is 100 sccm to 10 slm, the pressure in the chamber for crystal growth of the semiconductor layers is 6.68-40.05 kPa (50-300 Torr), and the growth temperature is 1000-1200° C. The barrier layer 13 may be an impurity-doped n-type $Al_{0.25}Ga_{0.75}N$ layer. The semiconductor layers may be formed through crystal growth by molecular beam epitaxy (MBE). The barrier layer 13 may be formed of InGaN, InAlN, or InAlGaN, other than AlGaN.

Figure 5B:
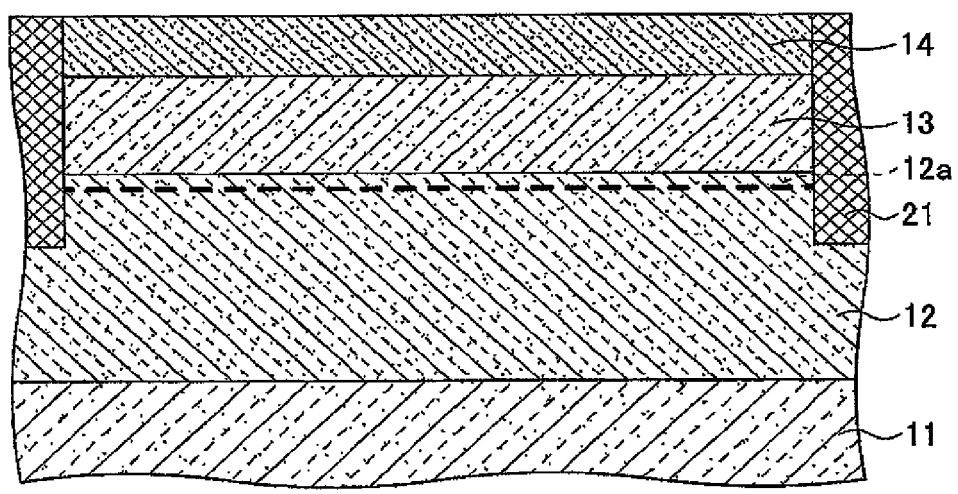
FIG. 5B illustrates in a cross-sectional view a semiconductor device manufacturing method according to the first embodiment.

Then, as illustrated in FIG. 5B, a device isolating region 21 is formed. More particularly, photoresist is applied to the surface of the cap layer 14, and patterned into a prescribed resist pattern through exposure and development using an exposure system. The resist pattern has an opening corresponding to an area in which the device isolating region 21 is to be formed. Then, ion implantation is performed using the resist pattern as a mask to introduce impurities so as to reach inside the electron transit layer 13. The impurity introduced region becomes the device isolating region 21. The resist pattern is then removed. As an alternative, using the resist pattern as a mask, the cap layer 14, the barrier layer 13, and a part of the electron transit layer 12 are removed by dry etching through the opening of the mask. An oxide film may be buried in the area from which the semiconductor layers have been removed.

Figure 5C:
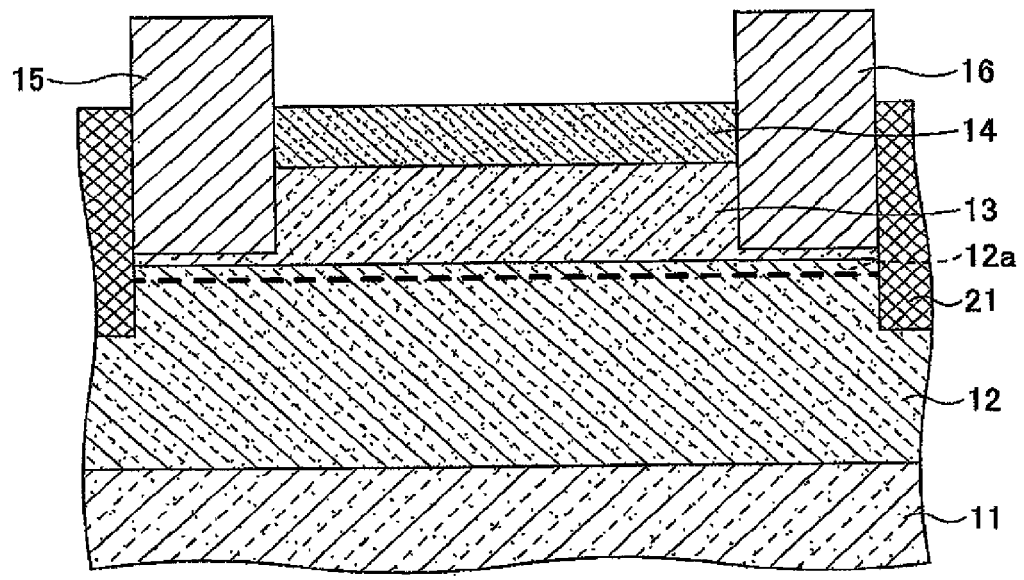
FIG. 5C illustrates in a cross-sectional view a semiconductor device manufacturing method according to the first embodiment.

Then, as illustrated in FIG. 5C, a source electrode 15 and a drain electrode 16 are formed. More particularly, photoresist is applied to the surface of the cap layer 14, and patterned into a prescribed resist pattern through exposure and development in the exposure system. The resist pattern has openings corresponding to areas in which the source electrode 15 and the drain electrode 16 are to be formed. Then, using the resist pattern as a mask, the cap layer 14 and a portion of the barrier layer 13 are removed by dry etching, such as reactive ion etching (RIE) using chlorine gas, through the openings of the mask. During the dry etching process, chlorine gas is introduced as an etching gas into the chamber at a flow rate of 30 sccm. The pressure in the chamber is set to about 2 Pa, and RF power of 20 W is applied. Then, a metal film such as a Ta/Al layered film is formed by vacuum vapor deposition or other suitable methods. Then, unnecessary portions of the metal film are removed, together with the resist pattern, by a lift-off method. Thus, the source electrode 15 and the drain electrode 16 are formed. After the lift-off process, a thermal treatment is performed at 580° C. to create ohmic contacts.

Figure 5D:
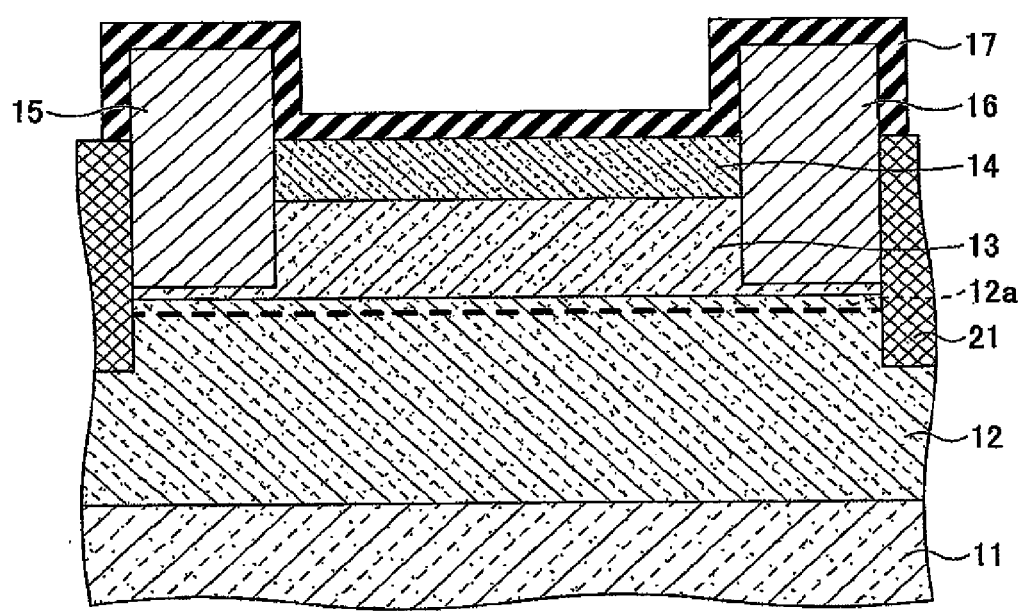
FIG. 5D illustrates in a cross-sectional view a semiconductor device manufacturing method according to the first embodiment.

Then, as illustrated in FIG. 5D, an insulating film 17 is formed over the cap layer 14, the source electrode 15 and the drain electrode 16. The insulating film 17 contains one or more materials selected from silicon oxide, aluminum oxide, hafnium oxide, tantalum oxide, zirconium oxide, yttrium oxide, lanthanum oxide, tantalum oxide, silicon nitride, aluminum nitride, and silicon oxynitride. It is preferable for the insulating film 17 to have a high relative permittivity. From the practical viewpoint, SiO2, SiN, $Al_2O_3$, SiON, $HfO_2$ are used preferably. The thickness of the insulating film 17 is 2 nm to 200 nm. The insulating film 17 is formed by plasma ALD, plasma CVD, or sputtering. If an aluminum oxide insulating film 17 is formed by plasma CVD, trimethylaluminum (TMA) and oxygen are supplied as source gases to produce plasma.

Figure 5E:
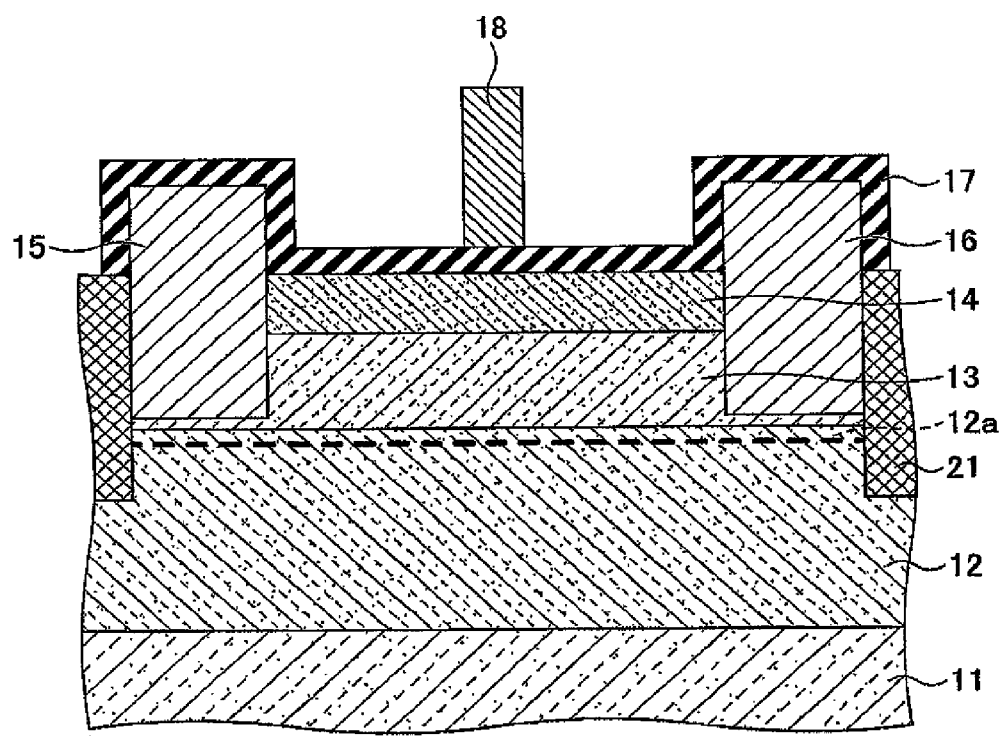
FIG. 5E illustrates in a cross-sectional view a semiconductor device manufacturing method according to the first embodiment.

Then, as illustrated in FIG. 5E, a gate electrode 18 is formed. More particularly, photoresist is applied to the surface of the insulating film 17, and patterned into a prescribed resist pattern through exposure and development in the exposure system. The resist pattern has an opening at a position where the gate electrode 18 is to be formed. Then, a metal film such as a Ni/Au layered film is formed by vacuum vapor deposition or other suitable methods. Then, unnecessary portions of the metal film are removed, together with the resist pattern, by a lift-off method. Thus, the gate electrode 18 is formed.

Figure 5F:
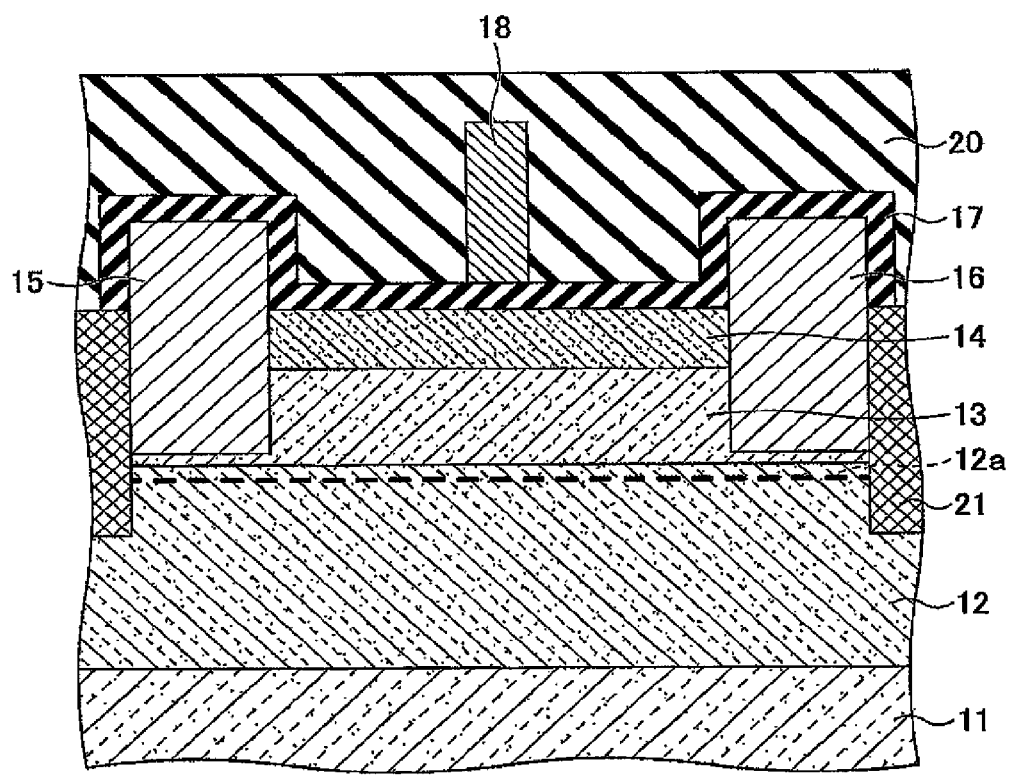
FIG. 5F illustrates in a cross-sectional view a semiconductor device manufacturing method according to the first embodiment.

Then, as illustrated in FIG. 5F, a protection film 20 is formed. The protection film 20 contains one or more materials selected from silicon oxide, aluminum oxide, hafnium oxide, tantalum oxide, zirconium oxide, yttrium oxide, lanthanum oxide, tantalum oxide, silicon nitride, aluminum nitride, and silicon oxynitride. The protection film 20 is formed by a process not using plasma, such as thermal ALD, thermal CVD, or vacuum vapor deposition. When forming the aluminum oxide protection film 20 by thermal ALD, trimethylaluminum and water are alternately supplied while heating the substrate to 200-400° C.

Thus, the semiconductor device according to the first embodiment is fabricated. Because the protection film 20 is formed using a process without generating plasma, dielectric strength of a transistor with a protection film can be maintained even after the formation of the protection film.

Second Embodiment

The second embodiment is described below. FIG. 6A through FIG. 6G illustrate a semiconductor device manufacturing process according to the second embodiment.

Figure 6A:
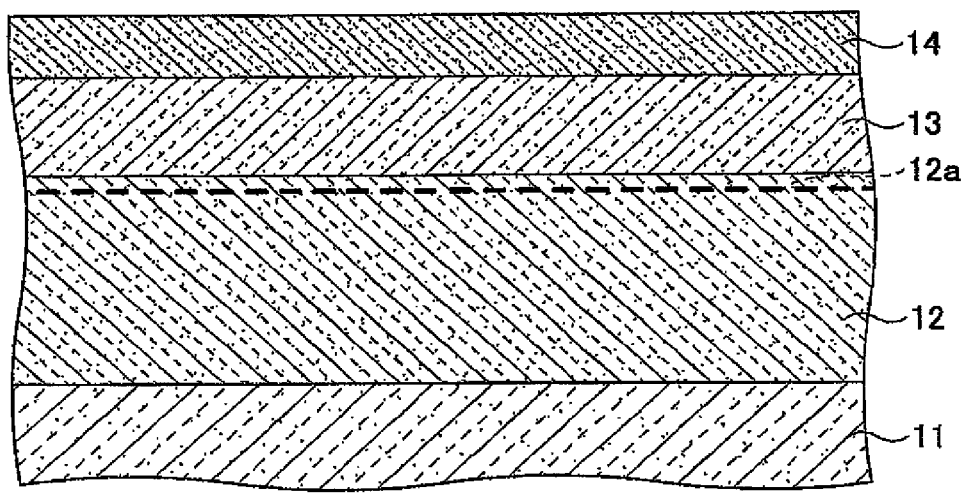
FIG. 6A illustrates in a cross-sectional view a semiconductor device manufacturing method according to the second embodiment.

First, as illustrated in FIG. 6A, a nucleation layer (not shown) is formed over a substrate 11. Semiconductor layers, including an electron transit layer 12, a barrier layer 13, and a cap layer 14, are epitaxially grown in this order by metal-organic vapor phase epitaxy (MOVPE).

The substrate 11 is, for example, a SiC substrate or a sapphire ($Al_2O_3$) substrate. The nucleation layer (not shown) formed over the substrate 11 is, for example, a non-doped intrinsic AlN (i-AlN) layer with a thickness of 0.1 μm. The electron transit layer 12 is a non-doped intrinsic GaN (i-GaN) layer with a thickness of 3.0 μm. The barrier layer 13 is a non-doped intrinsic $Al_{0.25}Ga_{0.75}N$ layer with a thickness of 20 nm. The cap layer 14 is a n-GaN layer with a thickness of 5 nm. A two-dimensional electron gas (2DEG) channel 12a is produced in the electron transit layer 12 near the barrier layer 13.

Figure 6B:
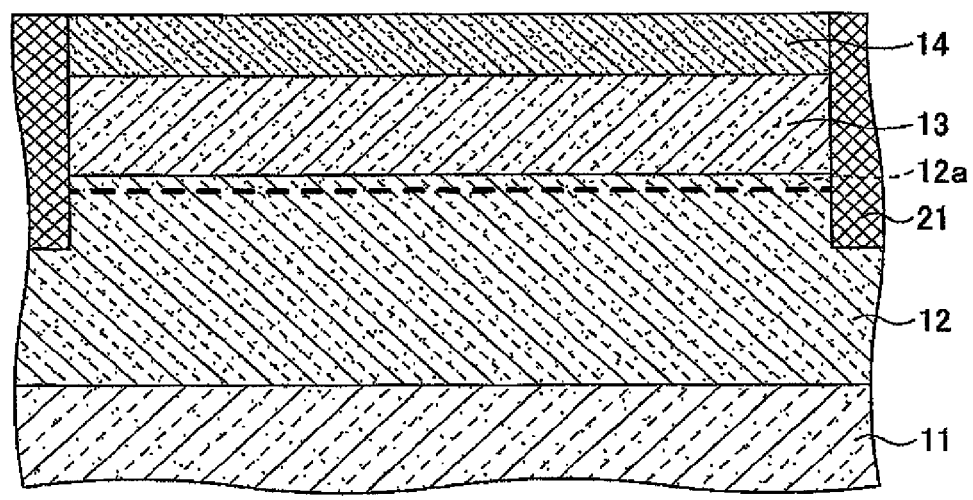
FIG. 6B illustrates in a cross-sectional view a semiconductor device manufacturing method according to the second embodiment.

Then, as illustrated in FIG. 6B, a device isolating region 21 is formed. More particularly, photoresist is applied to the surface of the cap layer 14, and patterned into a prescribed resist pattern through exposure and development using an exposure system. The resist pattern has an opening corresponding to an area in which the device isolating region 21 is to be formed. Then, ion implantation is performed using the resist pattern as a mask to introduce impurities so as to reach inside the electron transit layer 13. The impurity introduced region becomes the device isolating region 21. The resist pattern is then removed.

Figure 6C:
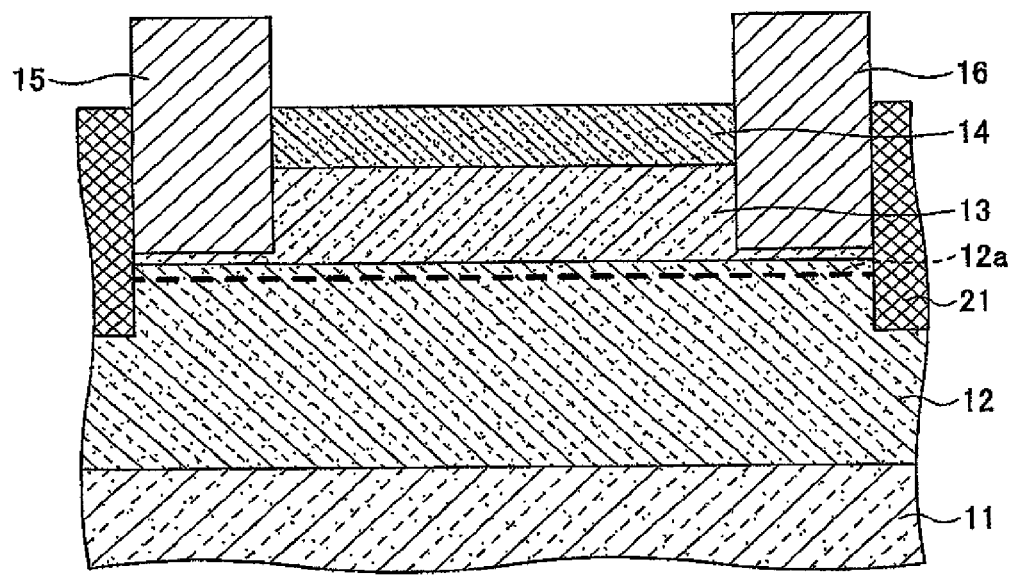
FIG. 6C illustrates in a cross-sectional view a semiconductor device manufacturing method according to the second embodiment.

Then, as illustrated in FIG. 6C, a source electrode 15 and a drain electrode 16 are formed. More particularly, photoresist is applied to the surface of the cap layer 14, and patterned into a prescribed resist pattern through exposure and development in the exposure system. The resist pattern has openings corresponding to areas in which the source electrode 15 and the drain electrode 16 are to be formed. Then, using the resist pattern as a mask, the cap layer 14 and a portion of the barrier layer 13 are removed by dry etching, such as a reactive ion etching (RIE) using chlorine gas, through the openings of the mask. Then, a metal film such as a Ta/Al layered film is formed by vacuum vapor deposition or other suitable methods. Then, unnecessary portions of the metal film are removed together with the resist pattern by a lift-off method. Thus, the source electrode 15 and the drain electrode 16 are formed. After the lift-off process, a thermal treatment is performed at a temperature of 580° C. to create ohmic contacts.

Figure 6D:
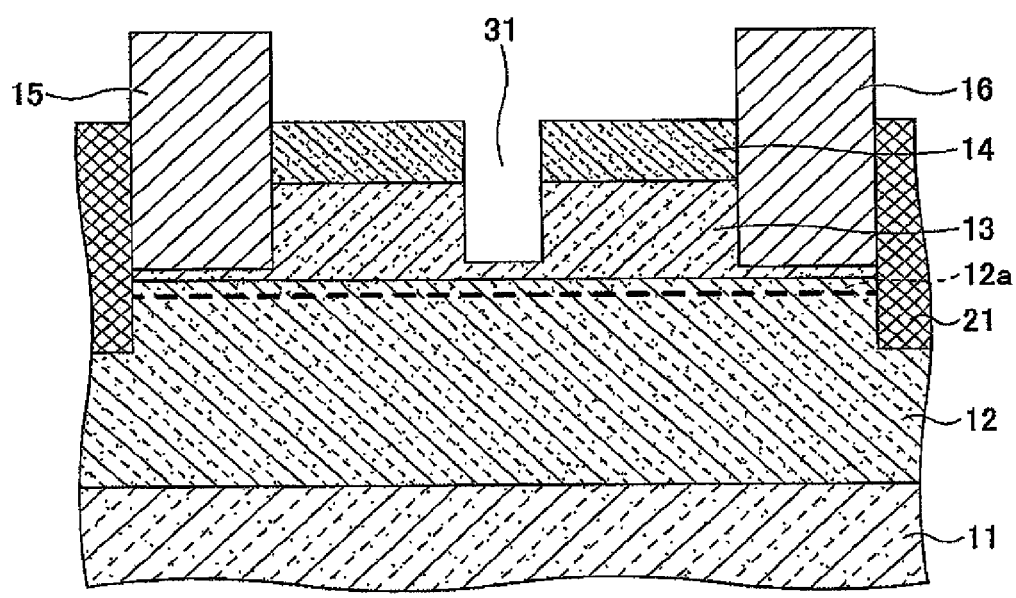
FIG. 6D illustrates in a cross-sectional view a semiconductor device manufacturing method according to the second embodiment.

Then, as illustrated in FIG. 6D, a recess 31 is formed. More particularly, photoresist is applied to the surface of the cap layer 14, and patterned into a resist pattern through exposure and development in the exposure system. The resist pattern has an opening corresponding to an area in which the recess 31 is to be formed. Then, using the resist pattern as a mask, the cap layer 14 and a portion of the barrier layer 13 are removed by dry etching, such as a reactive ion etching (RIE) using chlorine gas, through the openings of the mask. Then, the resist pattern is removed. During the dry etching process, oxygen or fluorine may be mixed in the etching gas. The recess 31 may be formed only in the cap layer 14 by etching a portion of the cap layer. Alternatively, the recess 31 may reach the electron transit layer 12 by removing the cap layer 14, the barrier layer 13, and a portion of the electron transit layer 12.

Figure 6E:
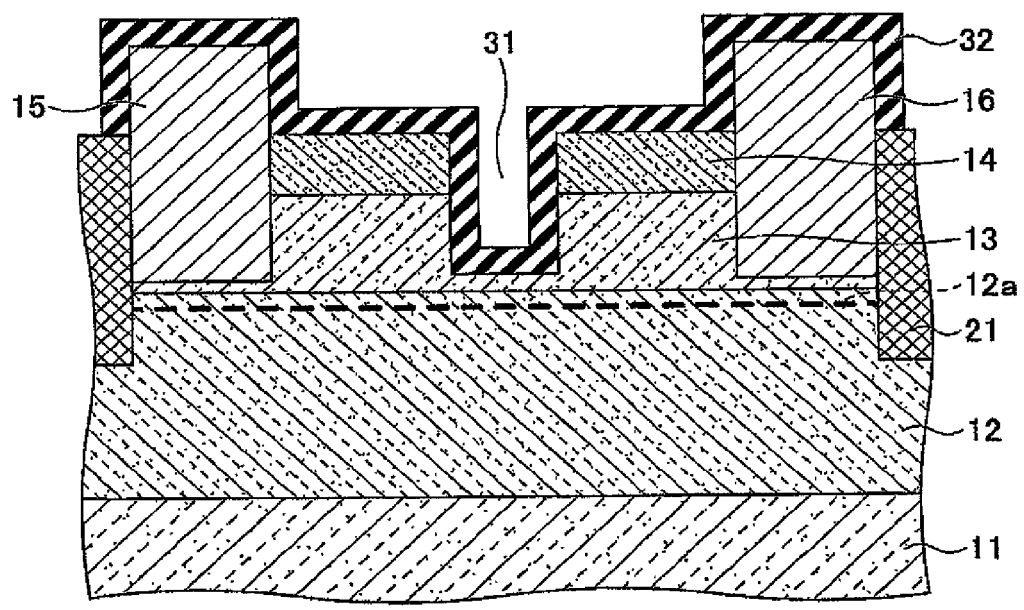
FIG. 6E illustrates in a cross-sectional view a semiconductor device manufacturing method according to the second embodiment.

Then, as illustrated in FIG. 6E, an insulating film 32 is formed over the inner face of the recess 31, over the cap layer 14, the source electrode 15 and the drain electrode 16. The insulating film 32 contains one or more materials selected from silicon oxide, aluminum oxide, hafnium oxide, tantalum oxide, zirconium oxide, yttrium oxide, lanthanum oxide, tantalum oxide, silicon nitride, aluminum nitride, and silicon oxynitride.

It is preferable for the insulating film 32 to have a high relative permittivity. From the practical viewpoint, $SiO_2$, SiN, $Al_2O_3$, SiON, $HfO_2$ are used preferably. The thickness of the insulating film 32 is 2 nm to 200 nm. The insulating film 32 is formed by plasma ALD, plasma CVD, or sputtering. When forming an aluminum oxide insulating film 32 by plasma CVD, trimethylaluminum (TMA) and oxygen are supplied as source gases to produce plasma.

Figure 6F:
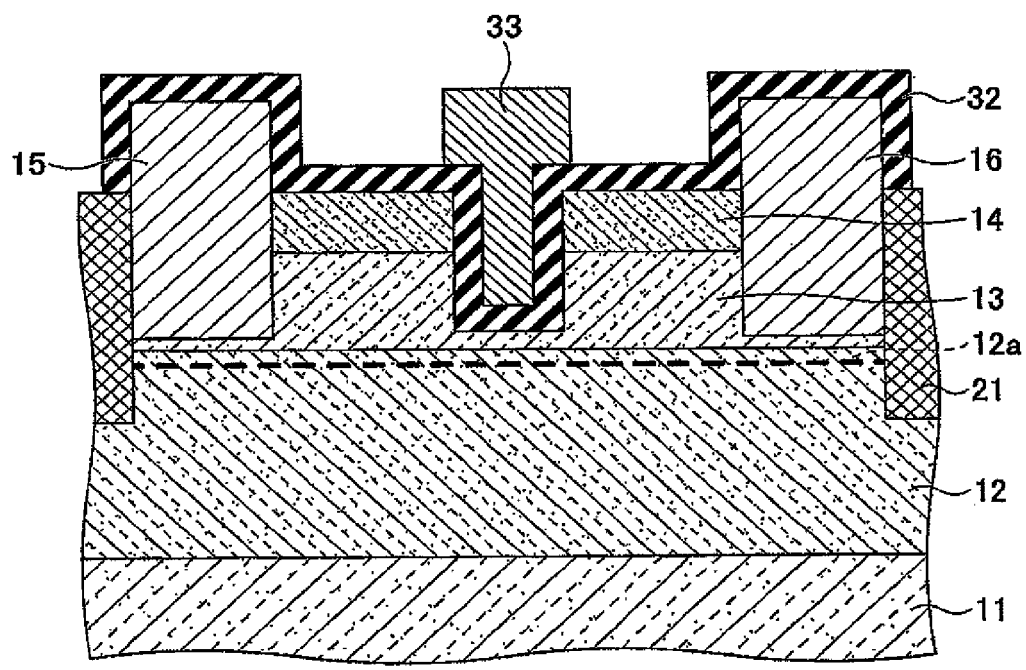
FIG. 6F illustrates in a cross-sectional view a semiconductor device manufacturing method according to the second embodiment.

Then, as illustrated in FIG. 6F, a gate electrode 33 is formed. More particularly, photoresist is applied to the surface of the insulating film 32, and patterned into a prescribed resist pattern through exposure and development in the exposure system. The resist pattern has an opening corresponding to the area in which the recess 31 is position. Then, a metal film such as a Ni/Au layered film is formed by vacuum vapor deposition or other suitable methods. Then, unnecessary portions of the metal film are removed together with the resist pattern by a lift-off method. Thus, the gate electrode 33 is formed.

Figure 6G:
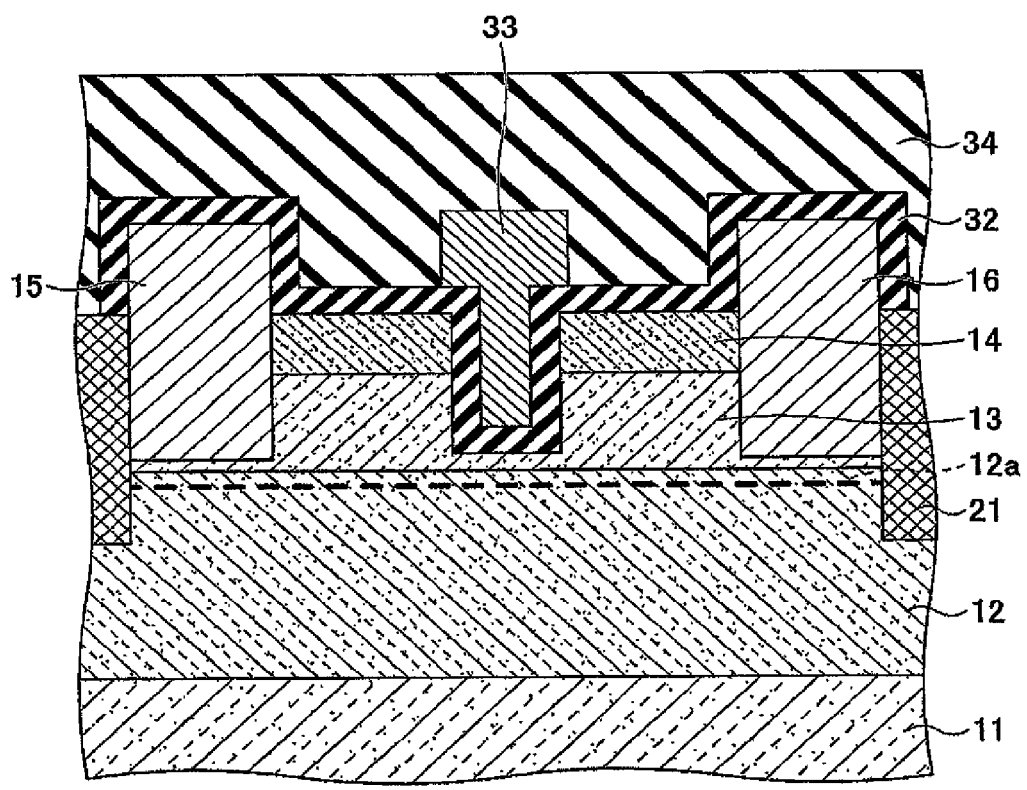
FIG. 6G illustrates in a cross-sectional view a semiconductor device manufacturing method according to the second embodiment.

Then, as illustrated in FIG. 6G, a protection film 34 is formed. The protection film 34 is formed of an insulating material, and an aluminum oxide is preferably used. The protection film 34 is formed by a process without using plasma, such a process including thermal ALD, thermal CVD, and vacuum vapor deposition. When forming an aluminum oxide protection film 34 by thermal ALD, trimethylaluminum (TMA) and water are alternately supplied while heating the substrate to 200-400° C.

Thus, the semiconductor device according to the second embodiment is fabricated.

The particulars other than the above-described process and structure of the second embodiment are the same as those of the first embodiment.

Third Embodiment

Next, explanation is made of the third embodiment. Dielectric strength of a semiconductor device is degraded when a protection film is formed over an insulating film. Such degradation in dielectric strength may be caused by a difference in coefficients of thermal expansion between the insulating film and the protection film, stress produced during the formation of the protection film, or residual water remaining between the insulating film and the protection film.

From this viewpoint, the difference in coefficients of thermal expansion between the insulating film and the protection film can be reduced to 2 ppm or less by forming both the insulating film and the protection film using metal-oxide materials. If the insulating film and the protection film are formed of the same metal-oxide material, the difference between the insulating film and the protection film can be reduced substantially to zero. The metal-oxide material may contain one or more elements selected from silicon, aluminum, hafnium, tantalum, zirconium, yttrium, lanthanum, and tantalum. To enhance the dielectric strength, it is preferable for the insulating film and the protection film to be in the amorphous state.

Figure 7:
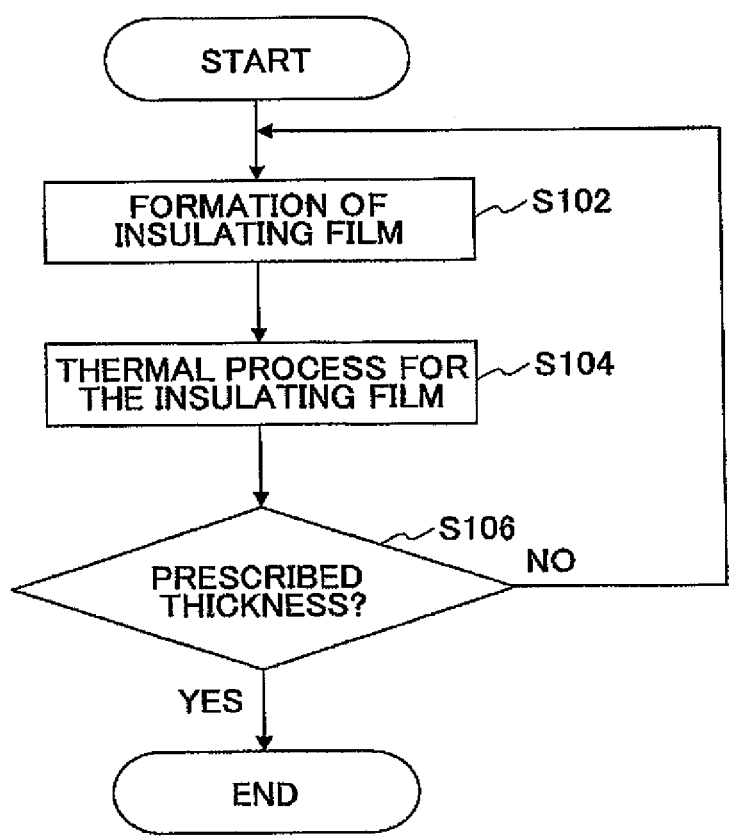
FIG. 7 is a flowchart illustrating a semiconductor device manufacturing method according to the third embodiment.

FIG. 7 is a flowchart illustrating a semiconductor device manufacturing method according to the third embodiment. The manufacturing method of the third embodiment is different from the second embodiment regarding the film formation process of the protection film 34. The particulars of the process are described below.

First, in step S102, an aluminum oxide film is formed by thermal ALD or thermal CVD to a thickness of 50 nm. Preferably, the thickness of the aluminum oxide film is in the range from 10 nm to 50 nm. If the thickness of the aluminum oxide film is less than 10 nm, the device is not suitable for practical use from the viewpoint of productivity. If the thickness of the aluminum oxide film is greater than 50 nm, pores are generated during the thermal process described below. It is presumed that pores are generated due to influence of desorbing water. The greater the thickness of the film, the more the pores generated. It is found that few pores are generated if the film thickness is at or below 50 nm. For this reason, it is preferable that the thickness of the aluminum oxide film formed at a time is 50 nm or less.

Then, in step S104, a thermal process is conducted at 700° C. The temperature of the thermal process is in the range from 500° C., to 800° C., and more preferably, from 650° C., to 800° C. If the temperature exceeds 800° C., the phase of the protection film may change from amorphous to crystal. For this reason, it is preferable to conduct the thermal process at or below 800° C.

Then, in step S106, it is determined if the thickness of the aluminum oxide film being formed has reached a predetermined thickness. If the aluminum oxide film has reached the predetermined thickness, the film formation process of the protection film 34 is terminated. If the thickness of the aluminum oxide film has not reached the predetermined value, the process returns to step S102 and the film deposition and thermal process are repeated until the film thickness reaches the predetermined value.

Using this method, a multilayer protection film 34 including two or more layers of metal oxide is formed.

Next, XPS (X-ray photoelectron spectroscopy) analysis results of the aluminum oxide film which serves as a protection film 34 are explained below. The XPS analysis is conducted using AXIS-His (manufactured and sold by Shimadzu Corporation) as the measuring equipment.

Figure 8:
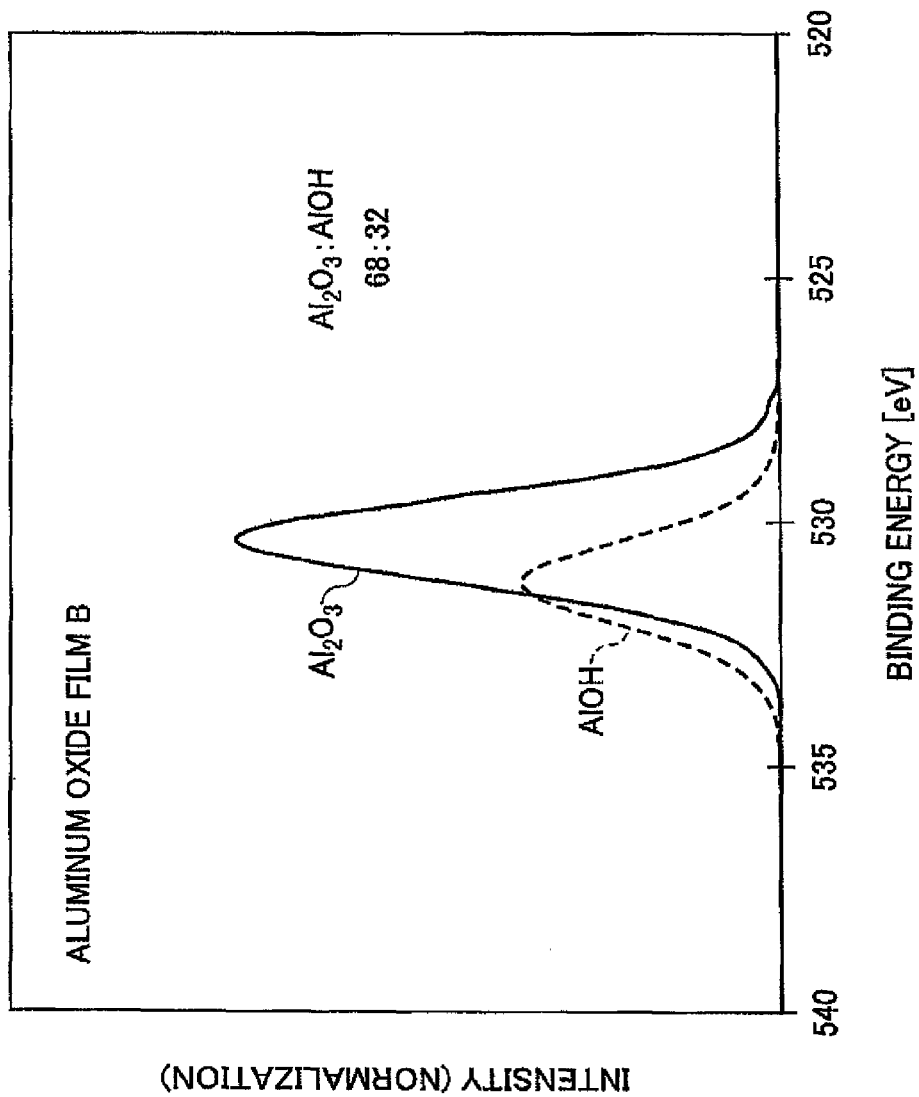
FIG. 8 illustrates an XPS measurement result of an aluminum oxide film B formed by thermal CVD.
Figure 9:
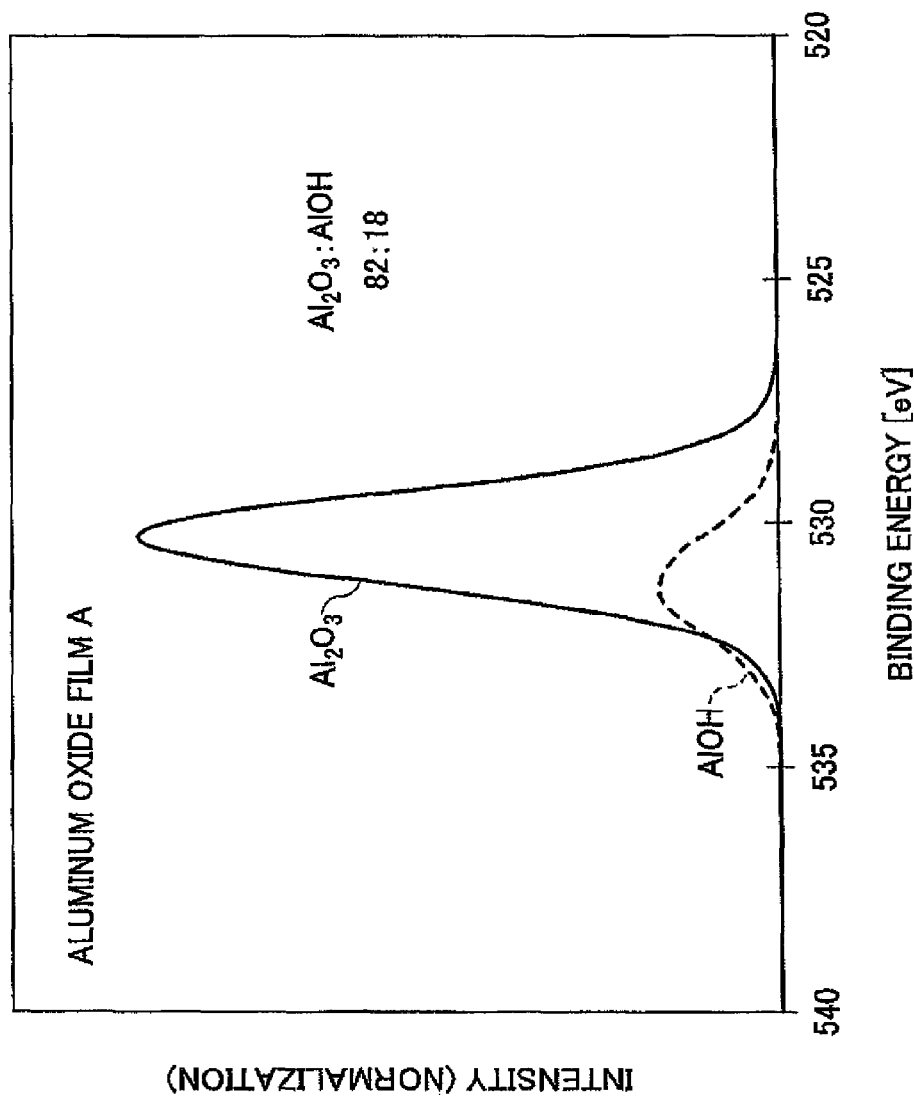
FIG. 9 illustrates an XPS measurement result of an aluminum oxide film A formed by the method illustrated in FIG. 7.

FIG. 8 illustrates the XPS measuring result of an aluminum oxide film 8, which film is continuously deposited by thermal CVD. FIG. 9 illustrates the XPS measuring result of an aluminum oxide film A, which is formed by a process illustrated in FIG. 7. In either example, a silicon substrate is used on which an aluminum oxide film of 200 nm thickness is formed. The aluminum oxide film B, that is, the continuously formed thermal CVD film contains 32% hydroxyl (AlOH). In contrast, the aluminum oxide film A formed by the process of the third embodiment contains 18% hydroxyl (AlOH). It is understood that the film formation method of an aluminum oxide film according to the third embodiment can greatly reduce the hydroxyl contained in the film. If hydroxyl (—OH) is contained in a metal-oxide film, water is likely to be adsorbed by hydrogen-bonding, and the water is desorbed by dehydrating condensation between hydroxyls due to the thermal history of the film formation process. Accordingly, it is desired to reduce the hydroxyl concentration in the aluminum oxide film.

Figure 10:
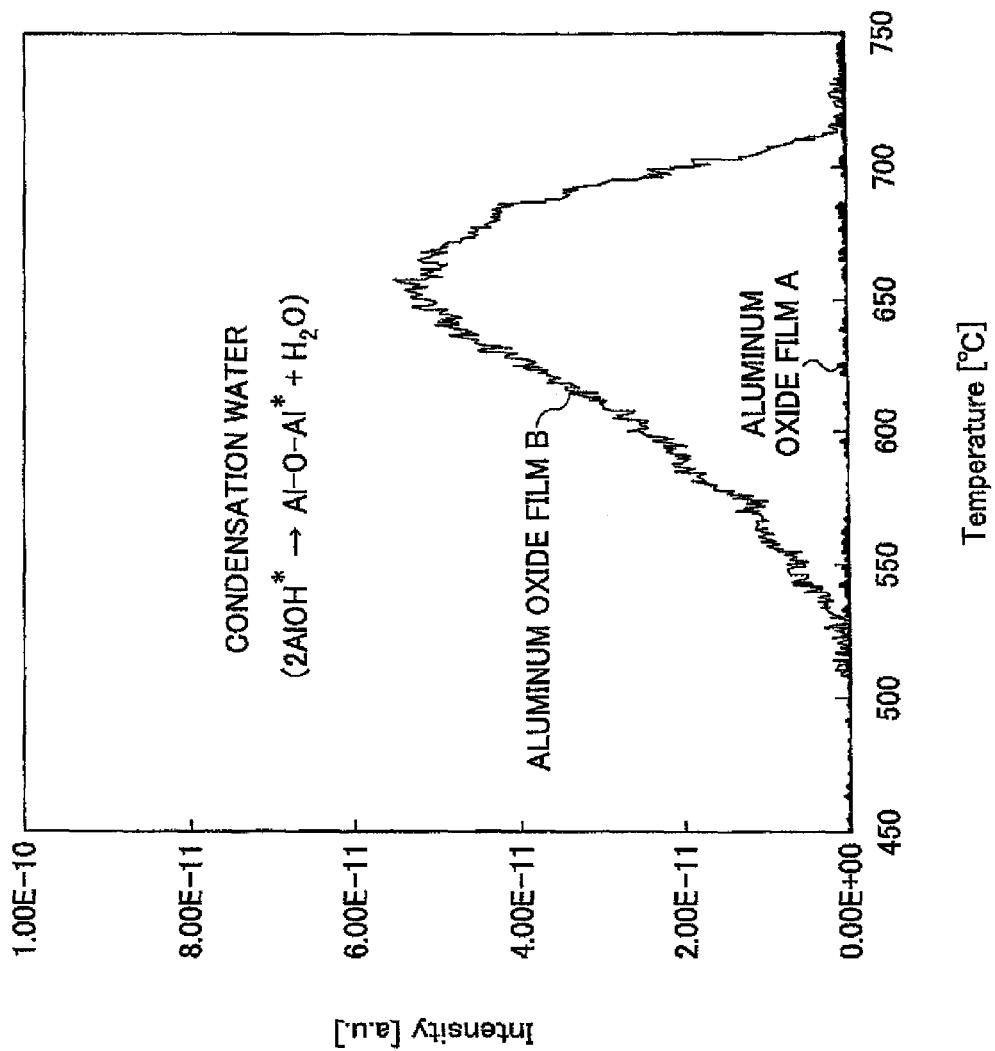
FIG. 10 is a diagram illustrating the relationship between temperature and desorption of water.

FIG. 10 illustrates a correlation between temperature and desorbing water in the aluminum oxide film. The measurement is made by thermal desorption spectroscopy (TDS) using a heating and degassing system "EMD 1000" manufactured and sold by ESCO Ltd. As illustrated in the graph, when the aluminum oxide film B formed continuously by thermal CVD is heated up to 500° C. or higher, water desorption due to dehydrating condensation between hydroxyls is observed. In contrast, with the aluminum oxide film A formed by the process of the third embodiment, little water desorption is detected. In the aluminum oxide film B, detection of desorbing water begins at or above 500° C., and reaches the peak level at 650° C. Accordingly, it is preferred to select the temperature range of the thermal process from 500° C. to 800° C., more preferably, from 650° C. to 800° C.

Figure 11:
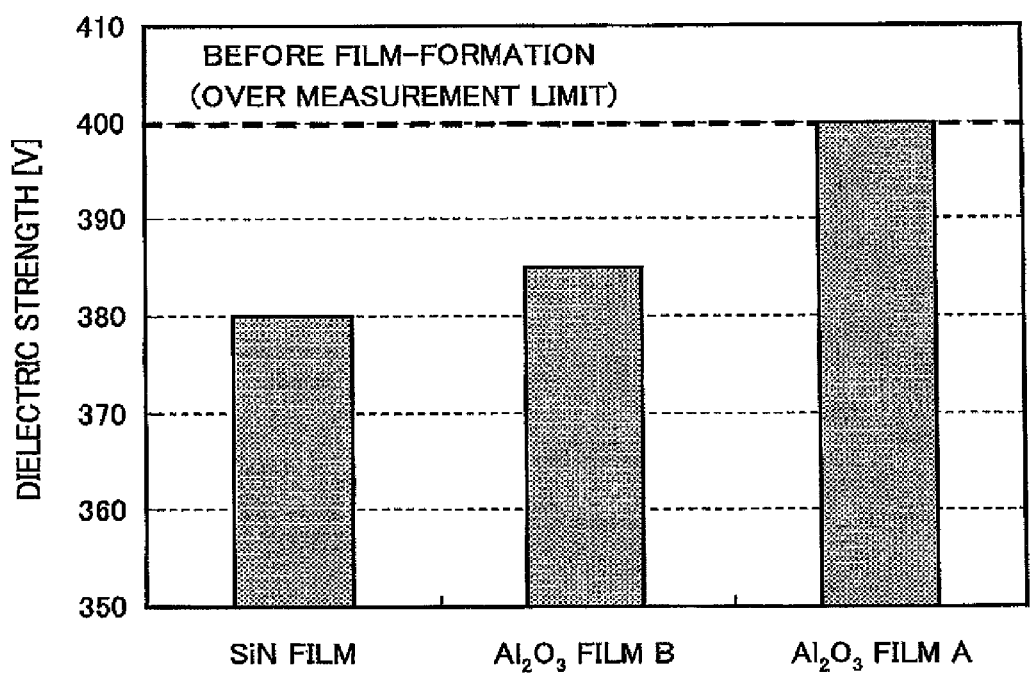
FIG. 11 is a diagram illustrating dielectric strength test results of protection films.
Figure 12:
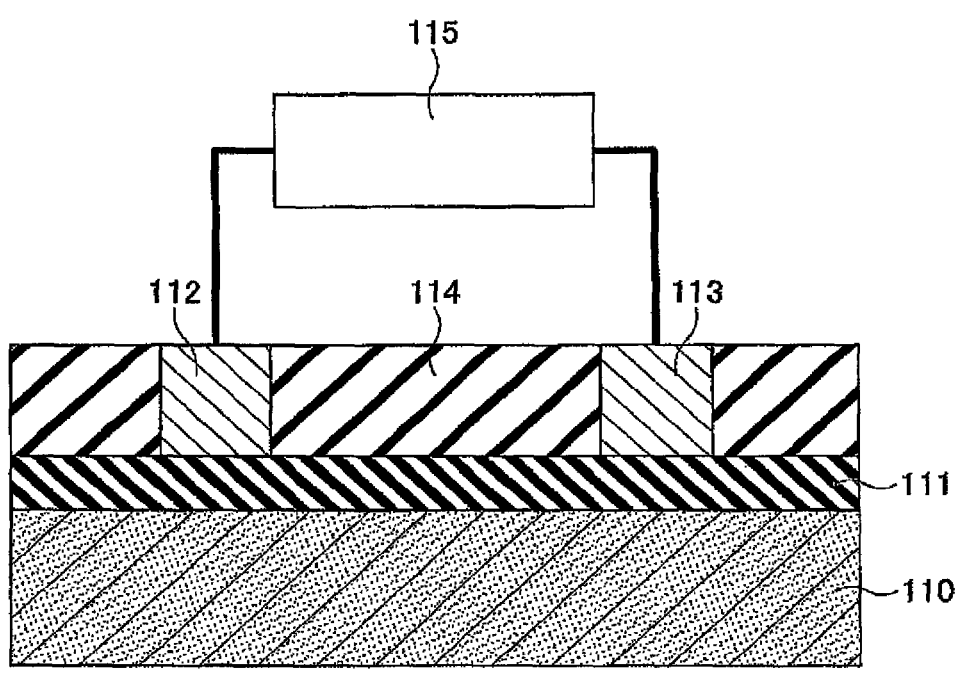
FIG. 12 is a schematic diagram illustrating measurement of dielectric strength of a protection film.

FIG. 11 illustrates a dielectric strength test result of the protection films. For the dielectric strength test, samples illustrated in FIG. 12 are fabricated and the measurements are conducted in the manner illustrated in FIG. 12. In each sample, an aluminum oxide film 111 is formed on a substrate 110, and electrodes 112 and 113 are arranged on the aluminum oxide film 111. Then, a different type of protection film 114, which becomes a measurement target, is provided over the aluminum oxide film 111 and between the electrodes 112 and 113. An I-V meter 115 is connected to the electrodes 112 and 113. As the protection film 114, the first-type sample has a SiN film, the second-type sample has an aluminum oxide film B formed continuously by thermal CVD, and the third-type sample has an aluminum oxide film A formed by the process of the third embodiment. A sample without the protection (insulating) film 114 is also fabricated, in which sample the aluminum oxide film 111 and the electrodes 112 and 113 are provided). As is clear from FIG. 11, the aluminum oxide film A formed according to the third embodiment has the highest dielectric strength, which is similar to that of the sample without the protection (insulating) film 114.

The protection film forming process of the third embodiment is applicable to the first embodiment. The particulars other than the above explanation are the same as those in the first embodiment or the second embodiment.

With the structure and the method disclosed in the embodiments, a sufficient level of dielectric strength is maintained in a semiconductor device (such as a transistor) having an insulating film inserted between a gate electrode and a semiconductor layer and covered with an insulating protection film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a first semiconductor layer formed over a substrate;
   a second semiconductor layer formed over the first semiconductor layer;
   a source electrode and a drain electrode formed over the second semiconductor layer;
   an insulating film formed over the second semiconductor layer;
   a gate electrode formed over the insulating film; and
   a protection film covering the insulating film, the protection film including a same material as the insulating film,
   wherein the protection film is in contact with a top face and at least a part of a side face of the gate electrode, the protection film being an aluminum oxide film formed by thermal ALD, and
   wherein the protection film contains less hydroxyls than the insulating film does.

2. The semiconductor device according to claim 1, wherein the protection film is a multilayer protection film.

3. The semiconductor device according to claim 1, wherein the insulating film includes an aluminum oxide formed by plasma CVD, plasma ALD, or sputtering.

4. The semiconductor device according to claim 1, further comprising:
   a third semiconductor layer positioned between the second semiconductor layer and the insulating film.

5. A semiconductor device comprising:
   a first semiconductor layer formed over a substrate;
   a second semiconductor layer formed over the first semiconductor layer;
   a source electrode and a drain electrode formed over the second semiconductor layer;
   a recess formed in the second semiconductor layer, or in the second semiconductor layer and a portion of the first semiconductor layer;
   an insulating film formed over the second semiconductor layer;
   a gate electrode formed on the insulating film inside the recess; and
   a protection film covering the insulating film, the protection film including a same material as the insulating film,
   wherein the protection film is in contact with a top face and at least a part of a side face of the gate electrode, the protection film being an aluminum oxide film formed by thermal ALD, and
   wherein the protection film contains less hydroxyls than the insulating film does.

6. The semiconductor device according to claim 5, wherein the protection film is a multilayer protection film.

7. The semiconductor device according to claim 5, wherein the insulating film includes an aluminum oxide formed by plasma CVD, plasma ALD, or sputtering.

8. The semiconductor device according to claim 5, further comprising:
   a third semiconductor layer positioned between the second semiconductor layer and the insulating film.

9. A semiconductor device comprising:
   a first semiconductor layer formed over a substrate;
   a second semiconductor layer formed over the first semiconductor layer;
   a source electrode and a drain electrode formed over the second semiconductor layer;

an insulating film formed over the second semiconductor layer;

a gate electrode formed over the insulating film; and a protection film covering the insulating film, the protection film including a same material as the insulating film, wherein the same material of the protection film as the insulating film is an aluminum oxide and the protection film contains less hydroxyls than the insulating film does.

10. A semiconductor device comprising:

a first semiconductor layer formed over a substrate;

a second semiconductor layer formed over the first semiconductor layer;

a source electrode and a drain electrode formed over the second semiconductor layer;

a recess formed in the second semiconductor layer, or in the second semiconductor layer and a portion of the first semiconductor layer;

an insulating film formed over the second semiconductor layer;

a gate electrode formed on the insulating film inside the recess; and a protection film covering the insulating film, the protection film including a same material as the insulating film, wherein the same material of the protection film as the insulating film is an aluminum oxide and the protection film contains less hydroxyls than the insulating film does.

* * * * *